United States Patent [19]

Sharples

[11] 3,747,089

[45] July 17, 1973

[54] ANALOG TO DIGITAL CONVERTER

[76] Inventor: Kenneth R. Sharples, 174 Birch St., Braintree, Mass. 02185

[22] Filed: Nov. 9, 1971

[21] Appl. No.: 196,996

[52] U.S. Cl.... 340/347 NT, 340/347 AD, 324/99 D

[51] Int. Cl. .......... H03r 13/20

[58] Field of Search .......... 340/347 NT, 347 CC, 340/347 AD; 324/99 D

[56] References Cited

UNITED STATES PATENTS

| | | | |
|---|---|---|---|
| 3,566,265 | 2/1971 | Reid | 340/347 NT |
| 3,566,397 | 2/1971 | Walton | 340/347 NT |

OTHER PUBLICATIONS

IBM Tech. Discl. Bull'n, entitled "Integrating Ramp Analog-to-Digital Converter," by Aasnaes et al., Vol. 11, No. 4, Sept. 1968, pages 386–387.

*Primary Examiner*—Thomas A. Robinson
*Attorney*—John A. Lahive, Jr.

[57] ABSTRACT

An analog to digital converter of the dual slope type, employing a high gain input amplifier as both a buffer and integrator and a second high gain amplifier as a comparator. The input voltage is coupled to the non-inverting input terminal of the integrator through a capacitor. A programmed switching circuit provides for switching of the coupling capacitor either to the input voltage or to an input common terminal and also provides for opening and closing a direct feedback loop from the comparator output and for switching the second input terminal of the integrating amplifier between a reference level and ground. The converter operates to charge the integrator capacitor for a fixed time at a rate proportional to the input voltage and then to discharge this capacitor at a rate proportional to the reference voltage, while a counter accumulates time base pulses, until the capacitor reaches its initial level, the accumulated counts being a digital representation of the input voltage.

15 Claims, 7 Drawing Figures

PATENTED JUL 17 1973 3,747,089

PATENTED JUL 17 1973

3,747,089

SHEET 3 OF 4

ANALOG TO DIGITAL CONVERTER

FIELD OF THE INVENTION

This invention relates in general to an analog to digital converter circuit and more particularly to an analog to digital converter circuit of the dual slope integrator type which exhibits high resolution in an efficient circuit design.

BACKGROUND OF THE INVENTION

Analog to digital converter circuits are well known in the prior art and often constitute a significant subsystem in larger electronic systems as well as finding direct employment in instruments to express a voltage input as a digital output. Thus, analog to digital converters have been used in a variety of applications, such as multi-function meters, transducer read outs and digital panel meters, the latter providing a digital readout from an instrument which may include a variety of circuits and transducers responding to specific physcial conditions. Depending upon the particular application, the requirements for the circuit may be quite stringent in terms of power requirements, size, economy, stability of performance, speed of response and resolution. In the prior art, a number of different basic circuitry approaches have been employed to perform the conversion function.

One type of circuitry which has met with some success is known as a dual slope integrator. In this circuit the input stage is typically an integrator formed from a high gain amplifier having an integrator capacitor, C, connected between its output terminal and the inverting input terminal. At the output of the integrator, a comparator circuit generates an output indication when the output voltage crosses a reference level. The circuit also includes a series of digital counters providing the digital output indication. The digital counters accumulate counts from an electronic clock which is gated, under control of the comparator output, to the input of the counters. A switching circuit is used to selectively connect either the input voltage or a reference voltage to the input terminal of the integrator. Usually both voltages are supplied to the switching point through a buffer amplifier. In operation the dual slope integrator has the voltage which is to be measured connected through a suitable switching circuit and a resistor of predetermined value R, to one of the input terminals of the integrating amplifier. The switching circuit connects this voltage to the input terminal and simultaneously gates the electronic clock to the input of the digital counter. During this portion of the cycle the integrating capacitor C, charges at a rate $e_{in}$/RC where $e_{in}$ is the unknown input voltage. The capacitor continues to charge until the counters reach a preset count limit, usually equal to full scale, thus resetting the counters to zero. At the occurrence of this event, the switching circuit switches the input terminal of the integrating amplifier to a reference voltage source and again gates the electronic clock pulses to the counters. The counters continue to accumulate pulses, but the integrating capacitor now discharges at a rate $e_{ref}$/RC where $e_{ref}$ is the reference voltage, until the output voltage from the integrating amplifier reaches the reference bias level of the comparator. When this level at the output of the integrating amplifier is reached, the output of the comparator stops the clock pulses to the counters. The accumulated count in the counters is a digital representation of the value of $e_{in}$.

One of the advantages of the dual slope type of converter arises from its relatively high insensitivity to temperature and other drift characteristics in the circuit components. Thus changes in the value of the resistance R or the integrating capacitance C will, to a first order, affect the charging cycle of the integrating capacitor in the same manner in which they affect the discharging cycle and hence the conversion factor between voltage and time (counts) stays constant, despite variations in the values of these circuit components. Again, provided that the bias level of the comparator is stabilized at the beginning of the charge cycle, variations in the absolute value of this level should not affect the accuracy or resolution of the conversion. While this basic circuit approach has proven very useful, some problems arise both in terms of the complexity of circuits required to provide stabilization and power in particular implementations of the dual slope circuit and to the use of the circuit in analog to digital converters which must have auto-polarity, that is, must respond automatically to input voltages of either polarity. These problems may arise, for example, in the complexity of circuits required to establish the comparator reference level with respect to the zero output level from the integrator. Also buffer amplifiers are required between the unknown voltage source and the integrator since the input to the integrator is normally at a relatively low impedance. Additionally bipolar power supply is required when using conventional operational amplifiers in order to allow the integrator to operate on small input voltages.

SUMMARY OF THE INVENTION

Broadly speaking, the analog to digital converter of this invention is of the dual slope type and employs an integrator including a high gain amplifier with an integrating capacitor connected between its output terminal and its inverting input terminal. The output of this integrating amplifier is connected to the inverting input terminal of a second high gain amplifier which serves as the comparator. The output of this comparator is coupled through suitable switching circuitry to gate an electronic clock supplying pulses to an appropriate chain of digital counters.

The non-inverting input to the amplifier forming the comparator stage is supplied directly from a reference voltage source, $e_{ref\,2}$, and the output terminal from the comparator is not only connected to gate the electronic clock, but is also connected back, through a switch, directly to the non-inverting input terminal of the integrating amplifier. This non-inverting input terminal of the integrating amplifier is also connected to one side of a capacitor, the other side of which is connected through suitable switching circuitry either to the input common or directly to the source of unknown voltage to be measured, $e_{in}$. The inverting input terminal to the integrating amplifier is connected through a resistance R and also through a suitable switching network, either to the circuit ground or to a temperature compensated reference voltage source, $e_{ref\,1}$.

In operation with a negative unknown input voltage, the circuit is first stabilized to provide that the output voltage will be $e_{ref\,1}$ by operating the switches such that the output terminal from the comparator is connected directly to the non-inverting input terminal of the integrating amplifier, the capacitor connected to the non-inverting terminal of the integrating amplifier has its other side connected to the input common, and the inverting input terminal of the integrating amplifier is connected to $e_{ref\,1}$. Under these circumstances the output terminal of the comparator amplifiers is at $e_{ref\,1}$ (± the sum of the loop offset voltages, $\Delta e_1$,referred to the input). Accordingly, the capacitor connected to the non-inverting terminal of the integrating amplifier is charged to $e_{ref\,1} + \Delta e_1$. The output terminal from the integrating amplifier is then at $e_{ref\,2} + \Delta e_2$ (the comparator amplifier offset voltage).

Next, the feedback connection from the output terminal of the comparator amplifier to the input of the integrating amplifier is opened and the other side of the capacitor connected to the non-inverting input terminal of the integrating amplifier is connected to the unknown voltage $-e_{in}$. Simultaneously, the electronic clock feeding pulses to the counters is gated on. Since the voltage at the non-inverting terminal has changed by precisely $-e_{in}$ the integrating capacitor will now commence charging at a rate $-e_{in}$/RC, where R is the series impedance to the reference voltage and C is the value of the integrating capacitor. When the counter has accumulated a predetermined number of pulses, the other side of the capacitor connected to the non-inverting input terminal of the integrating amplifier is switched to the input common and the other side of the series impedance R at the inverting input terminal of the integrating amplifier is switched to ground. Under these conditions the integrating capacitor starts to discharge at a rate $e_{ref\,1}$/RC. When the value of the voltage across the integrating capacitor reaches $e_{ref\,2}$, the output signal from the comparator amplifier goes sharply negative gating off the electronic clock pulses applied to the counter and the number of accumulated pulses in the counter is now a digital representation of the value of the applied input voltage $-e_{in}$. Upon this occurrence suitable manipulation of the switching will return the converter to its initial state.

When the input voltage is positive rather than negative, generally the same sequence of events takes place, with the exception that in the initially switched condition, the voltage $+e_{in}$ is connected to the other side of the capacitor connected to the non-inverting input terminal of the integrating amplifier, thus charging that capacitor initially to voltage $(e_{ref\,1} + \Delta e_1) - e_{in}$. In the next portion of the cycle, then, the terminal of that capacitor is connected to the input common. Under these circumstances, the charge and discharge cycles continue to have slopes of $-e_{in}$/RC and $e_{ref}$/RC, respectively.

With the circuit configuration described, the integrating amplifier can also serve as a buffer amplifier for both the unknown input voltage and for the termperature compensated reference voltage $e_{ref\,1}$. This advantage stems from the arrangement whereby the unknown voltage is connected to the non-inverting terminal while the integrating capacitor and point of reference are coupled to the inverting input terminal. Accordingly the amplifier may be considered as arranged in a potentiometer mode providing high input impedance.

The inclusion of the capacitor between the non-inverting input terminal of the integrating amplifier and the input voltage allows the circuit to employ a unipolar power supply, provides a high degree of common mode rejection, and also allows the circuit to be operated as a bipolar converter. The first advantage results because the input voltage is defined with respect to an external reference point, for example, ground, yet as applied to the input of the integrating amplifier, it is defined with respect to the reference voltage plus the amplifier offset voltage. Accordingly by appropriate selection of the reference voltage, the circuit will respond to small values of input voltage without the necessity of a bipolar power supply. The common mode rejection is high since the external reference point can be at a voltage, i.e., the common mode voltage, greater or less than ground potential. The manner by which the circuit functions as a bipolar converter will be described in detail below.

Another feature of this circuit configuration lies in the fact that the offset voltages are included in the stabilization cycle and the precision with which the bias voltage on the integrating capacitor is set prior to a measurement cycle. The use of a high gain amplifier as a comparator amplifier and the direct connection, during stabilization, between the comparator output terminal and the non-inverting input terminal of the integrating amplifier provides that the output terminal of the integrating amplifier and thus the bias on the integrating capacitor must be at precisely the comparator reference voltage plus the comparator amplifier offset voltage. During this same stabilization cycle the other capacitor is charged to the integrator reference voltage, $e_{ref\,1}$ plus the loop offset voltage $\Delta e$, referred to the input and this voltage becomes the reference point for the integrating amplifier.

DESCRIPTION OF PREFERRED EMBODIMENTS

Figure 1:
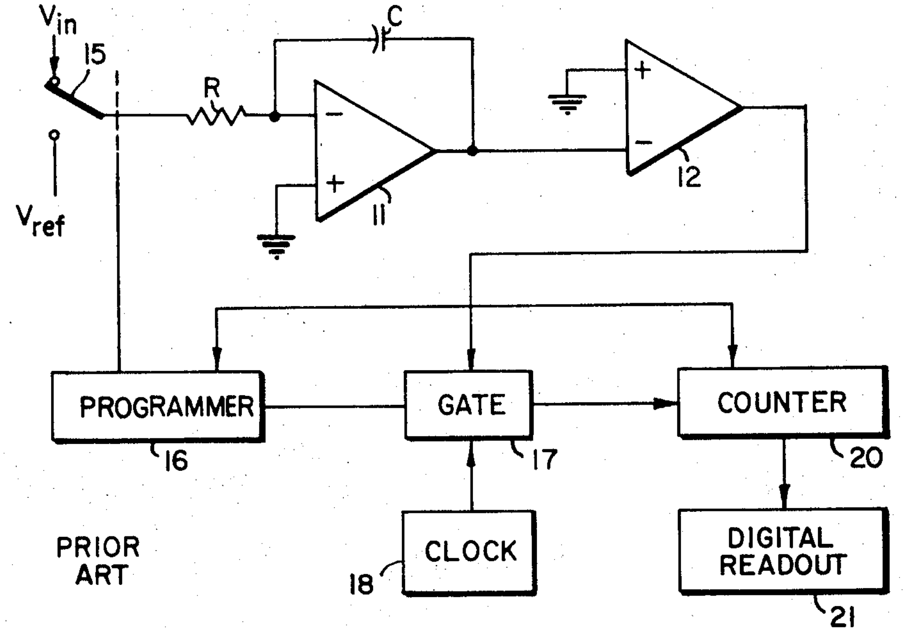
FIG. 1 is an illustration in block diagrammatic form of a prior art analog to digital converter.
Figures 1A, 2:
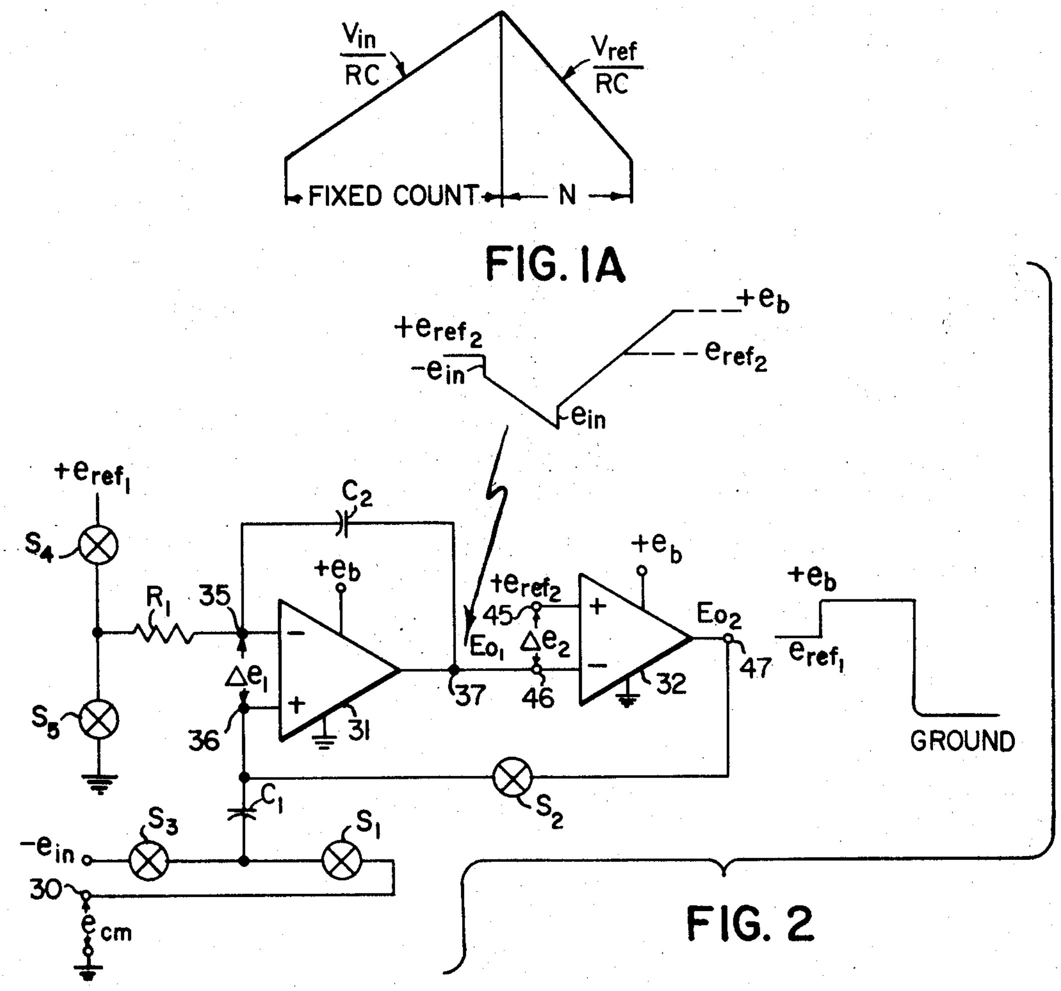
FIG. 1*a* is an illustration of the voltage output of the integrator of FIG. 1.
FIG. 2 is an illustration in block diagrammatic form of the analog section of an analog to digital converter constructed in accordance with the principles of this invention.

With reference to FIG. 1, there is illustrated an analog to digital converter known in the prior art and including a dual slope integration scheme. The converter includes an analog section which is formed of the integrating amplifier 11 with the integrating capacitor C and the comparator amplifier 12. The output from the comparator 12 is applied to a gate 17 which passes pulses from the electronic clock 18 to the counter 20, the latter providing a digital readout 21. A programmer 16 controls the sequencing of the switch 15 operation at the inverting input to the amplifier 11. In operation, input switch 15 is set at $V_{in}$ where $V_{in}$ represents the unknown voltage to be measured, at the beginning of the measurements. The counter 20 is reset to a zero condition at this time. As illustrated in the diagram of FIG. 1*a*, the capacitor C charges at a rate $V_{in}/RC$ and thus the voltage waveform at the output of amplifier 11 appears as illustrated in FIG. 1*a*. The capacitor C is allowed to charge for a period of time corresponding to a fixed count in counter 20 and, at the conclusion of the fixed count a signal is provided to programmer 16 changing the switch 15 position from $V_{in}$ to $V_{ref}$, where $V_{ref}$ is a reference voltage. The capacitor C now commences to discharge at a rate $V_{ref}/RC$ and continues to discharge until the input voltage from integrating amplifier 11 reaches a zero level as detected by the zero comparator amplifier 12. When the output of the amplifier 11 is zero the zero comparator output amplifier 12 provides an output signal to gate 17 gating off the pulses from the clock 18. Thus, during the discharge cycle the counter 20 has been accumulating pulses and, depending upon the value of $V_{in}$, and consequently the voltage which was reached across capacitor C, the time required for discharge of the capacitor to the present zero level will vary and this variation is expressed in digital terms by the counter 20. The accumulated counts (N) in counter 20 are, therefore, proportional to the input voltage $V_{in}$ and are displayed on the digital readout unit 21 as a digital representation of the value of that voltage.

One of the problems associated with the simplified version of an analog to digital converter, as illustrated in FIG. 1, is that the amplifier 11 and 12 exhibit both drift and direct current offsets. The offsets affect the resolution and accuracy of the analog to digital converter. Solutions to these problems may include means of introducing a stabilization cycle to stabilize the amplifiers at a particular DC offset prior to the conversion of the cycle. A second problem arises when it is desired to operate the circuit for bipolar input voltages with auto-polarity response. Circuitry must be included which allows the reference voltage to have the opposite effect from the input voltage, that is, to discharge the voltage to which the integrating capacitor has charged. Additionally, the reference level to the circuit must be such that the input voltage can swing both positively and negatively with respect to it. The prior art circuits have required a bipolar power supply to meet this requirement as well as to allow small voltages to be measured.

In FIG. 2 there is illustrated an analog input section for an analog to digital converter constructed according to the present invention. The analog section includes an integrating high gain amplifier 31 with an integrating capacitor $C_2$ connected between the output terminal 37 and the inverting input terminal 35. Also connected to the inverting input terminal 35 through series resistor $R_1$ is the junction between a pair of switches $S_4$ and $S_5$, the former connecting to a temperature compensated reference voltage $e_{ref\,1}$, while the latter connects to circuit ground. The reference voltage is made substantially equal to the maximum value of the unknown analog input voltage, which is to be measured. The non-inverting input terminal 36 has connected to it a capacitor $C_1$, with the other side of capacitor $C_1$ being connected between the junction of switches $S_1$ and $S_3$. Switch $S_1$ connects the capacitor $C_1$ to an input common terminal 30, and the input voltage $-e_{in}$ is referenced to this same terminal. Because of the d.c. isolation provided by capacitor $C_1$, this terminal may be at a voltage level, i.e., the common mode voltage, $e_{cm}$, above or below the system ground. Switch $S_3$ connects the capacitor $C_1$ to the analog input voltage to be measured. The output terminal 37 of integrating amplifier 31 is also connected to the inverting input terminal 46 of a high gain comparator amplifier 32. The non-inverting input terminal 45 of amplifier 32 is connected to a second positive reference voltage $e_{ref\,2}$ which is approximately a volt less than the voltage, $e_b$, from the power supply, thereby allowing the integrating capacitor to charge a maximum amount in the negative direction. The output terminal 47 from this amplifier is connected back through switch $S_2$ to the non-inverting input terminal 36 of amplifier 31.

In the initial stage of operation of the circuit switches $S_1$, $S_2$ and $S_4$ are all closed. Under these conditions terminal 36 must go to $+e_{ref\,1} \pm\Delta e_1$ where $\pm\Delta e_1$ is the sum of the loop offset voltages referred to the input. If all switches have zero offset voltages, then $E_{o2}$ must equal $+e_{ref\,1} \pm\Delta e_1$. $E_{o1}$ must equal $+e_{ref\,2} \pm\Delta e_2$, where $\pm\Delta e_2$ is the input offset voltage of amplifier 32. Capacitor $C_1$ charges to $e_{ref\,1} \pm\Delta e_1$, assuming $e_{cm} = 0$. In the next stage of the operation cycle switch $S_1$ and $S_2$ are opened and $S_3$ is closed. Thus $-e_{in}$ is gated to the non-inverting input terminal of amplifier 31. Initially, then, the output $E_{o1}$ drops sharply by $-e_{in}$ and, correspondingly the output $E_{o2}$ goes to its positive stop, $+e_b$. The integrating capacitor $C_2$ now charges at a rate $-e_{in}/RC_2$. The voltage across capacitor $C_1$ remains at $e_{ref\,1} \pm\Delta e_1$. This condition continues for a preset count, for example, a count of 1,000 for a three digit converter. At the conclusion of the preset count switches $S_3$ and $S_4$ are opened and switches $S_5$ and $S_1$ are closed. The voltage appearing across $R_1$ is now $-e_{ref}$ and the capacitor $C_2$ now discharges at a rate $e_{ref\,1}/R_1C_2$ until the output signal $E_{o1}$ appearing on terminal 37 reaches $e_{ref\,2} \pm \Delta e_2$. At this point the input signals to the comparator amplifier 32 are precisely balanced and the output voltage appearing at $E_{o2}$ falls to ground. This signal is used to gate off the counters which have been accumulating counts during the entire latter portion of the cycle and the accumulated count provides a measure of the value of the negative input voltage $-e_{in}$. When this event occurs, $S_2$ and $S_4$ are again closed while $S_5$ is open and all of the output signals return to their initial values.

While the above operation has been described for a negative input voltage, the circuit may be operated with positive input voltages. If the input voltage $e_{in}$ is positive then the programmer sequences the switches in generally the same fashion as for the negative input voltage but with the important distinction that the sequence of operation of switches $S_1$ and $S_3$ is reversed. Thus, in the initial stage switch $S_3$ is closed and switch $S_1$ is open, $S_2$ remaining closed and $S_4$ remaining open. The capacitor $C_1$ will be charged to a voltage $[e_{ref\,1} \pm\Delta e_1] - e_{in}$. In the next portion of the cycle when switch $S_1$ is closed the bottom terminal of capacitor $C_1$ drops to the common mode level (a difference of $-e_{in}$) and accordingly input terminal 36 of the integrating amplifier 31 initially drops by the value $e_{in}$. Thus, capacitor $C_2$ charges at a rate $-e_{in}/R_1C_2$ and on the second portion of the cycle when switch $S_3$ is again closed, as is switch $S_5$, the capacitor discharges at a rate $e_{ref\,1}/R_1C_2$. The reference voltage $e_{ref\,1}$ is set at a value providing for operation in the optimum dynamic range of the amplifier. The value of $e_{ref\ 2}$ for the comparator amplifier 32 is set at a different value than $e_{ref\ 1}$ for the integrating amplifier. The value of $e_{ref\ 2}$ is set about 1 volt below $e_b$. In the stabilization step the capacitor $C_2$ charges to a voltage which is the difference between $e_{ref\ 1}$ for the integrating amplifier 31 and $e_{ref\ 2} \pm\Delta e_2$ for the comparator amplifier 32.

Figure 3:
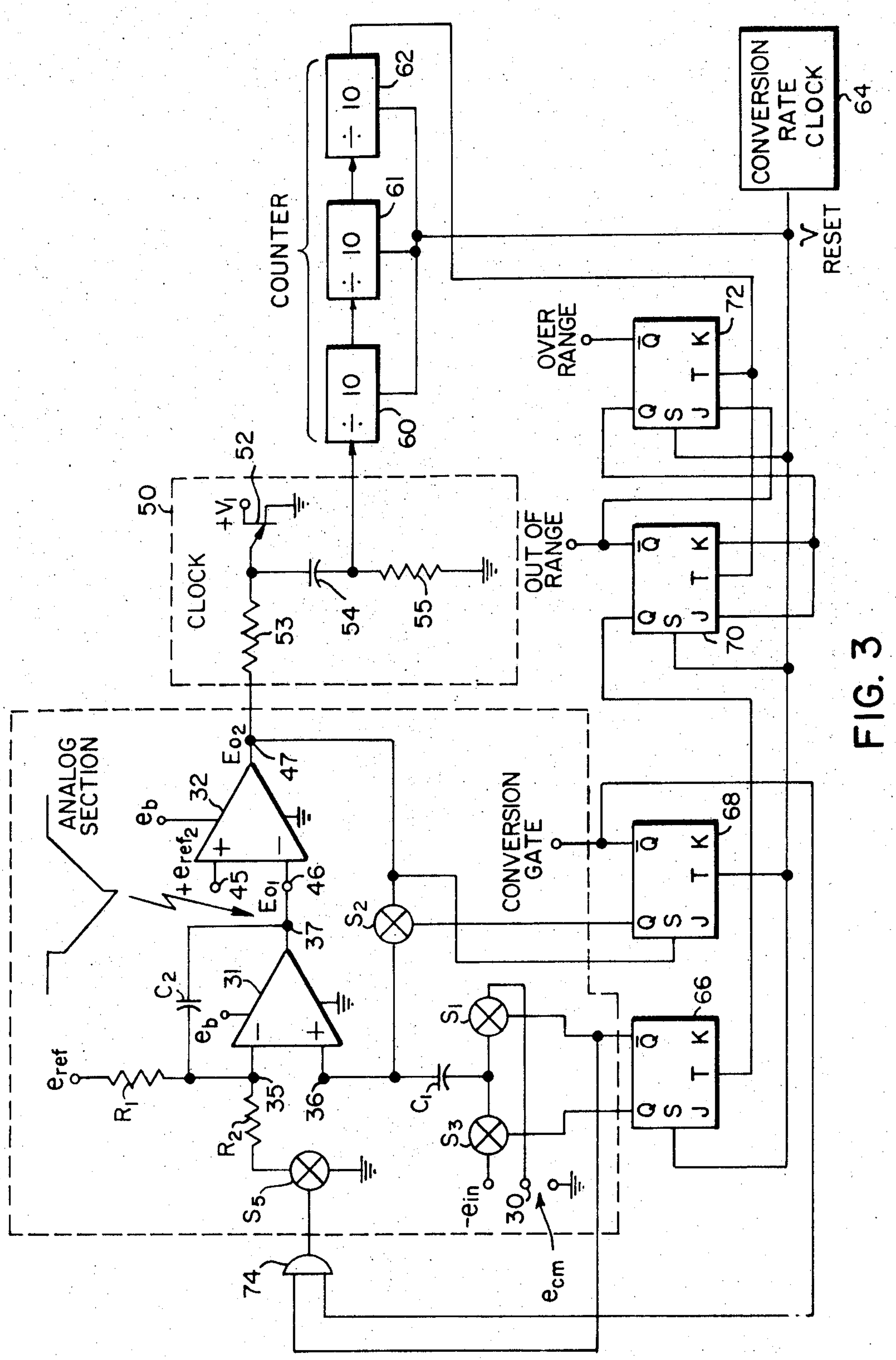
FIG. 3 is an illustration in block diagrammatic form of a unipolar analog to digital converter constructed in accordance with the principles of this invention.

In FIG. 3 there is illustrated a unipolar three digit analog to digital converter including a programmer section and digital read out section. The analog section in FIG. 3 is substantially identical to the analog section in FIG. 2, with the exception that reference voltage is connected to the inverting input terminal 35 of amplifier 31 directly through resistor $R_1$ and switch $S_5$ connects the terminal 35 to ground through a second resistor $R_2$. This eliminates the requirement for switch $S_4$ and, under this arrangement, the negative charge on the integrating capacitor $C_2$ becomes $-e_{in}/R_1C_2$, while the charge rate in the positive direction on that capacitor is $e_{ref\ 1}/R_2C_2$.

The programming section of the converter of FIG. 3 is formed from the conversion rate clock 64 and series of flip-flops 66, 68, 70, and 72. The flip-flops are conventional flip-flops having $j$ and $k$ inputs and a toggle input $t$ with both $q$ and $\bar{q}$ outputs.

The digital stage of the converter is constituted of a series of decade counters 60, 61 and 62, supplied with input pulses from an electronic clock 50. The electronic clock 50 is an oscillator formed from a unijunction transistor 52, capacitor 54 and resistors 53 and 55. The clock is turned on by a positive voltage applied across the resistor 53.

In operation, the rate clock 64 output pulse resets flip-flops 66, 70 and 72 as well as the decade counters 60, 61 and 62. This rate clock 64 output also toggles flip-flop 68. As a result switches $S_1$, $S_2$ and $S_5$ are opened, while switch $S_3$ is closed. With switch $S_3$ closed the capacitor $C_2$ is charged from the voltage source $-e_{in}$. The initial action of connecting $-e_{in}$ through switch $S_3$ to the input terminal 36 results in the output $E_{o2}$ going positive, which triggers clock 50 into oscillation, which supplies pulses to the decade counter chain, 60 61 and 62. When the decade counter overflows at 1,000 counts the output from counter 62 causes flip-flops 70 and 72 to toggle. When flip-flop 70 toggles it also provides a toggling input to flip-flop 66 which toggles, opening switch $S_3$ and closing switches $S_1$ and $S_5$. Under these conditions the integrating capacitor $C_2$ charges at a rate $e_{ref\ 1}/R_2C_2$ until the output voltage $E_{o1}$ appearing at terminal 37 of amplifier 31 reaches a value of $e_{ref\ 2} \pm\Delta e_2$. When this value is reached the output $E_{o2}$ from the comparator amplifier 32 goes negative toward the negative stop, cutting off the positive voltage to clock 50 and thus stopping the oscillation of this clock with a resultant termination of the supply of input pulses to the counters 60, 61 and 62. The negative value of $E_{o2}$ also sets flip-flop 68 which closes switch $S_2$ and opens switch $S_5$. Accordingly, all of the amplifier outputs go to their static reference levels and the analog section is now direct current stabilized.

At this point the counter chain 60, 61 and 62 contains the digitized value of the input signal $-e_{in}$ and the output from the $\bar{q}$ flip-flop 58 provides an output indication that the conversion has been completed. In the event that the time required for the capacitor $C_2$ to reach $e_{ref\ 2}$ is greater than the time required for the converters to reach 999, then the overflow signal from counter 62 toggles flip-flop 72 providing the over range digit 1. Flip-flop 70 would not toggle at this point since its $j$, $k$ inputs are zero. If, however, the count reached 1999, then the toggling of flip-flop 72 would cause flip-flop 70 to toggle providing an "out of range" output signal from the $\bar{q}$ terminal of flip-flop.

Figures 4, 4A:
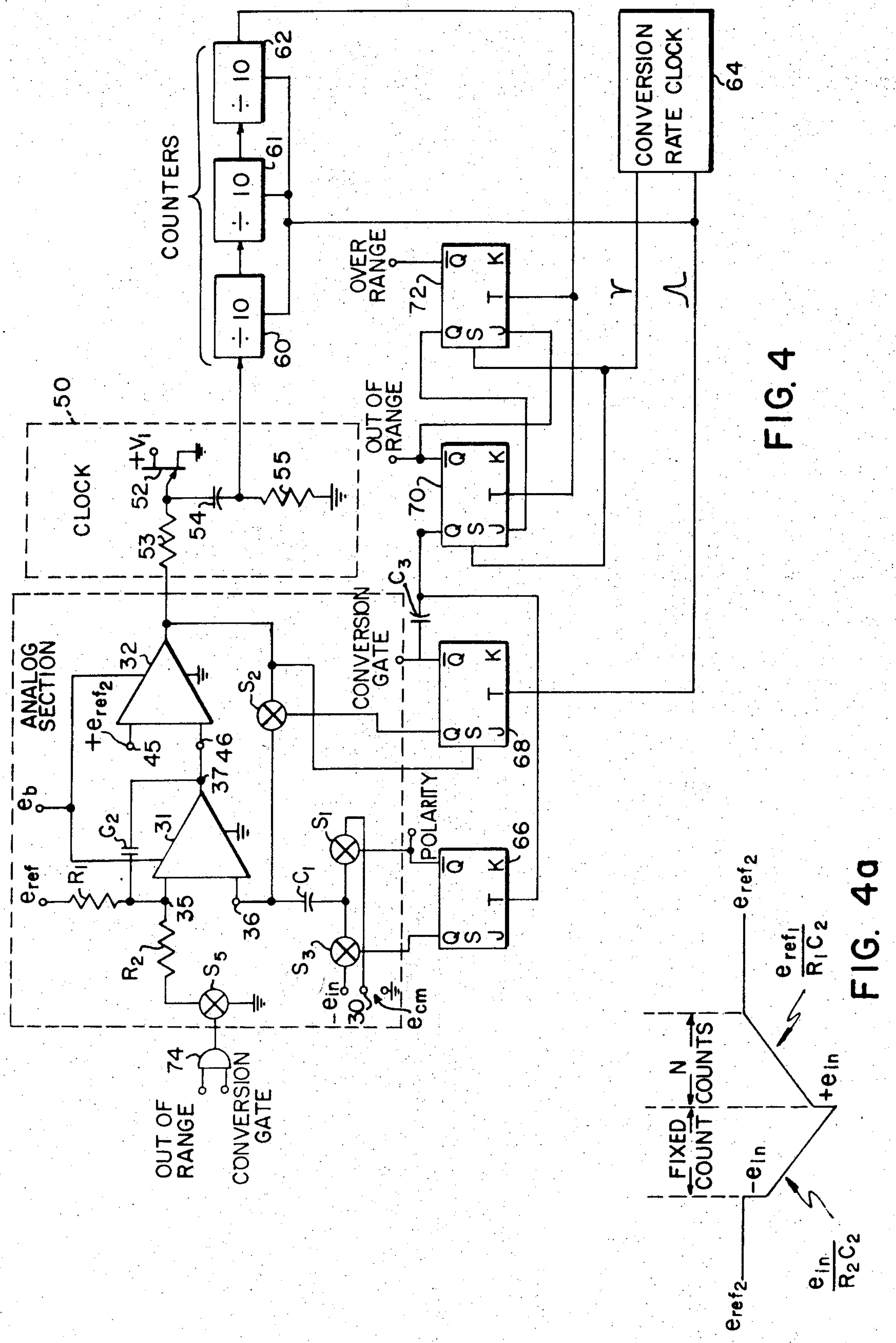
FIG. 4 is an illustration of an analog to digital converter constructed in accordance with the principles of this invention and including auto-polarity.
FIG. 4*a* is an illustration of the voltage output characteristic of the integrator of FIG. 4.

In FIG. 4 the analog to digital converter circuit is generally as shown in FIG. 3, but is arranged for automatic polarity response. In the programmer of the circuit of FIG. 4 the conversion rate clock 64 has two output pulses of opposite polarity. The flip-flops 66, 68, 70 and 72 are arranged to trigger on the negative edge of the conversion rate clock pulses and have passive pull-ups on their outputs. A suitable form of flip-flop for this purpose is a diode transistor logic flip-flop. With this circuit arrangement, the negative going trigger from the conversion rate clock 64 resets flip-flops 70 and 72 and the positive going output resets the counter chain 60, 61 and 62. On the trailing edge of the input toggling pulse to flip-flop 68, this flip-flop toggles and a trigger pulse is coupled from output $\bar{q}$ of flip-flop 68 through capacitor $C_3$ to the toggle input of flip-flop 66. As a result the input voltage $e_{in}$ is connected to capacitor $C_1$ and, provided that $e_{in}$ has negative value, the sequence proceeds exactly as did the sequence for the converter of FIG. 3.

If, however, $e_{in}$ is positive, then the output $E_{o2}$ will go negative and thus will not initiate oscillation of clock 50, but will provide a set pulse to flip-flop 68. Under these conditions switch $S_2$ will close and the analog section will stabilize with $S_3$ closed and $S_1$ open, thus charging the capacitor $C_1$ to a voltage $(e_{ref\ 1} \pm\Delta e_1 - e_{in})$. When the next reset pulse flip-flop 66 toggles turning $S_1$ on and $S_2$ and $S_3$ off. Accordingly a negative input potential is provided to the non-inverting input terminal of the integrator.

Suitable values and components for the circuit of FIG. 4 are tabulated below.

| | |
|---|---|
| $e_{ref\ 1}$ | 1.2 volts |
| $e_{in}$ (full scale) | ±199.9 millivolts |
| $e_b$ | 5 volts |
| $C_1$ | 0.68 μf |
| $C_2$ | 0.1μf |
| $R_1$ | 68.1KΩ |
| $R_2$ | 6.04KΩ |
| Amplifier 31 | LM308(Nat'l Semiconductor) |
| Amplifier 32 | LM301A(Nat'l Semiconductor) |
| Counters 60, 61 and 62 | 7490 (Std. TTL) |
| Flip-flops 66, 68, 70 and 72 | 9093 (Std. DTL) |
| Switches $S_1$, $S_2$, $S_3$ and $S_5$ | 4016 (CMOS) |
| Transistor 52 | 2N4892 |

Figure 5:
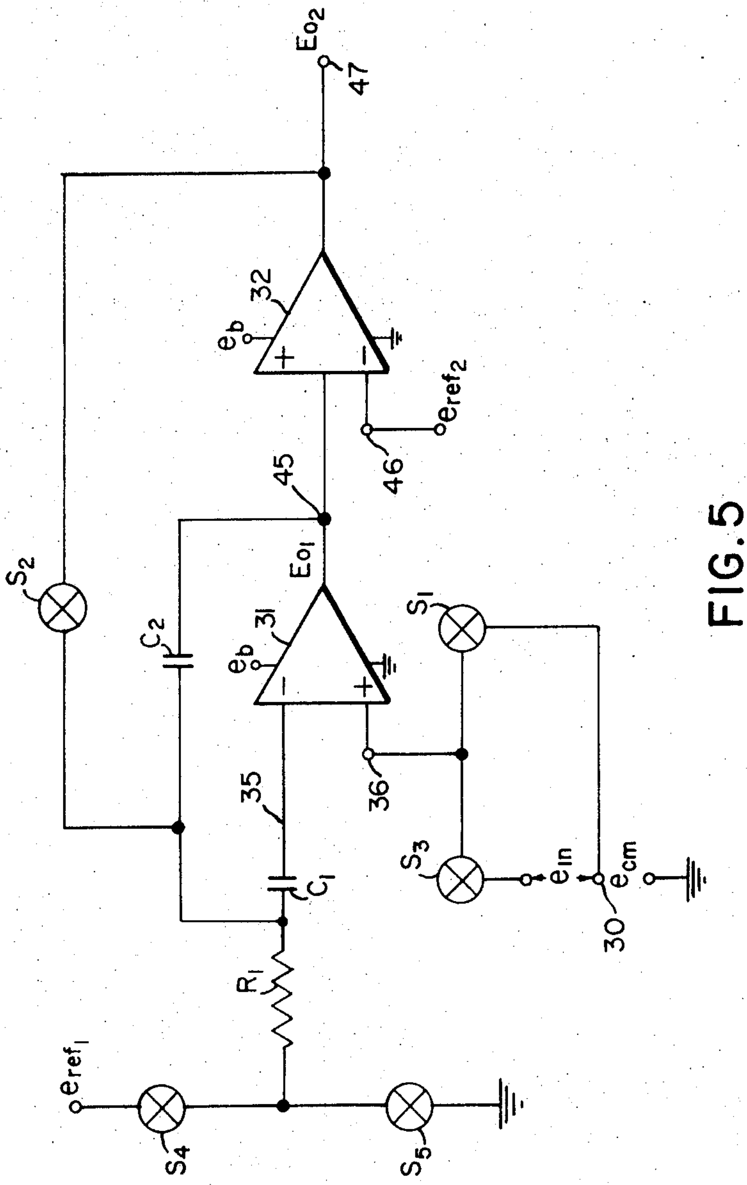
FIG. 5 is an illustration of an alternative embodiment of an analog to digital converter constructed in accordance with the principles of this invention.

In FIG. 5 an embodiment of the converter is illustrated in which the capacitor $C_1$ is coupled between the inverting input terminal 35 and resistor $R_1$. In the stabilization cycle the capacitor $C_1$ again gets charged to $+e_{ref\ 1} + \Delta e_1$. For a negative value of $e_{in}$ the operation proceeds as in the emobodiment of FIG. 2. However if $e_{in}$ is positive, the circuit is arranged to reverse the operation of switches $S_4$ and $S_5$. Thus the capacitor $C_1$ is initially charged to $\Delta e_1$ by closing switch $S_5$ in conjunction with the closure of switches $S_1$ and $S_2$. When switches $S_1$ and $S_2$ are opened and switch $S_3$ is closed the capacitor $C_2$ charges at a rate $+e_{in}/R_1C_2$ until the counter is filled. The circuit is then switched so that $S_4$ is closed together with $S_1$ and switches $S_3$ and $S_5$ are opened. Accordingly $E_{o1}$ drops by $-e_{in}$ due to the closure of switch $S_1$ and the capacitor $C_2$ charges at a rate $-e_{ref\ 1}/R_1C_2$ since the closure of $S_4$ raises the input end of resistor $R_1$ by $+e_{ref}$.

I claim:

1. An analog to digital converter for providing a digital output indication of the value of an input voltage appearing between first and second measurement terminals comprising, an integrator circuit including a high gain amplifier having first and second input terminals and an output terminal and an integrating capacitor coupling said output terminal and said first input terminal, and a second capacitor having one side connected to said second input terminal;

first and second reference voltage levels;

a digital output means including a source of clock pulses and a digital counter for accumulating said clock pulses;

means operative in a first portion of an operating cycle of said counter for connecting said integrator first input terminal to said first reference voltage level for charging said integrating capacitor to a predetermined voltage and for charging said second capacitor to a voltage equal to the difference between said first reference levels and the voltage level at one of said measurement terminals, means operative during a second portion of a cycle of operation for switching the other side of said second capacitor to the other of said measurement terminals and for charging said integrating capacitor in a first direction at a rate proportional to said applied input voltage while simultaneously gating said digital output indicator to accumulate pulses in said digital counter from said digital clock, said second portion of said operation cycle being terminated when said digital counter has accumulated a predetermined number of counts from said source of clock pulses, and means operable at the completion of said second portion of said operating cycle to initiate a third portion of said operating cycle during which said integration first input terminal is connected to said second voltage reference level and said second capacitor is connected between said integrator second input terminal and the measurement terminal to which it was connected during said cycle first portion, and during which said integrating capacitor is discharged at a rate proportional to said first reference voltage level while simultaneously said digital output indicating means is operated to supply pulses from said source of clock pulses to said digital counters, the pulses to said digital counters being stopped when the voltage level across said integrating capacitor reaches the preset voltage to which said integrating capacitor was charged in the initial portion of said cycle.

2. An analog to digital converter circuit for providing a digital output indication of applied input voltage comprising, an analog stage;

a digital output stage; and control circuitry;

said digital output stage comprising a source of clock pulses and a digital counter, said source of clock pulses having a control input responsive to applied signals for supplying pulses to the input of said digital counter;

said analog stage comprising, an integrator amplifier having first and second input terminals and an output terminal, an integrating capacitor connected between said output terminal and said first input terminal an integrator reference voltage supply, and a comparator having, first and second inputs, an output connected to the control input of said source of clock pulses, and a comparator reference voltage supply, the output terminal from said integrating amplifier being connected to one of said comparator inputs, the second of said comparator inputs being connected to said comparator reference voltage supply, a second capacitor having one side connected to said integrating amplifier second input terminal;

first, second and third switching means, said first switching means selectively connecting said integrating amplifier input terminal to either said reference voltage supply or a point of potential reference, said second switching means selectively connecting the other side of said second capacitor either to said point of potential reference or to said applied input voltage, said third switching means connecting or disconnecting said comparator output terminal to said integrating amplifier second input terminal, said control circuitry comprising, first control means operable in an initial stage of operation, for operating said first switching means to connect said integrating amplifier first input terminal to said reference supply, for operating said second switching means to connect the other side of said second capacitor to said point of potential reference when said applied input voltage is negative, and for operating said third switching means to directly connect the output terminal from said comparator to said integrating amplifier second input terminal, said first operating stage continuing until both the input terminals of said integrating amplifier are substantially at said integrator reference voltage level, second control means operable upon completion of said first stage to operate said switching means in a second stage of operation such that said first switching means continues to connect said integrating amplifier first input terminal to said integrator source of reference voltage, said second switching means connects the other side of said second capacitor to said applied input voltage, if said applied input voltage is negative, and said third switching means disconnects the output of said comparator from the second input terminal of said integrating amplifier, the resulting change in output signal from said comparator actuating said source of clock pulses to supply clock pulses to said counter, said second stage of operation continuing until said source of clock pulses has applied pulses to said counter equal to a predetermined number, said control circuitry initiating, upon accumulation by said digital counter of said predetermined number of pulses a third stage of operation, third control means operable in said third stage of operation for operating said first switching means to connect said integrating amplifier first input terminal to said point of potential reference and for operating said second switching means to connect the other side of said second capacitor to said point of potential reference and said third switching means continuing to disconnect said comparator output terminal from said integrating amplifier second input terminal, said source of clock pulses continuing to supply pulses to said digital counter until said comparator output falls below said comparator reference voltage level.

3. An analog to digital converter in accordance with claim 2 wherein said integrator amplifier has a unipolar power supply.

4. An analog to digital converter in accordance with claim 2 wherein said control circuitry is operable during said first and third stage, if said input voltage is positive, to operate said second switching means to connect the other side of said second capacitor to said applied input voltage and is operable during said second stage, if said applied input voltage is positive, to operate said second switching means to connect the other side of said second capacitor to said point of potential reference.

5. An analog to digital converter in accordance with claim 2 wherein said integrating amplifier is a high gain amplifier and said first terminal is an inverting input terminal and said second terminal is a non-inverting input terminal.

6. An analog to digital converter in accordance with claim 5 wherein said comparator circuit comprises a high gain amplifier wherein said second input is a non-inverting input terminal and said first input is an inverting input terminal.

7. An analog to digital converter circuit in accordance with claim 2 wherein said first switching means includes a resistor which in said first stage is connected between said integrating amplifier first input terminal and said integrator reference supply voltage and in said third stage is connected between said integrating amplifier first input terminal and said point of potential reference.

8. An analog to digital converter circuit in accordance with claim 2 wherein said first switching means includes first and second resistors, said first resistor always being connected between said integrating amplifier first input terminal and said integrator reference voltage supply; said second resistor being connected between said point of potential reference and said integrating amplifier first input terminal during said third stage of operation.

9. An analog to digital converter circuit in accordance with claim 2 wherein said control circuitry comprises a rate conversion clock coupled to provide toggling pulses to a plurality of flip-flops whereby said flip-flops actuate said switching means to terminate said first stage and initiate said second stage in response to a pulse from said conversion rate clock and to terminate said second stage and initiate said third stage in response to a signal from the output of said comparator.

10. An analog to digital converter in accordance with claim 1 wherein when said applied input voltage level is of opposite polarity from said first reference voltage level with respect to said second reference voltage and is connected during said second portion of the operating cycle between said integrator second input terminal and said applied input voltage level.

11. An analog to digital converter in accordance with claim 10 wherein when said applied input voltage level is of the same polarity as said first reference voltage level with respect to said second reference voltage level said second comparator being connected during said first and third portions of the operating cycle between said integrator second input terminal and said second portion of the operations cycle between said integration second input terminal and said second reference voltage level.

12. An analog to digital converter in accordance with claim 1 wherein said digital output means includes means providing an output indicator of the polarity of said applied input voltage level.

13. An analog to digital converter in accordance with claim 11 and including a comparator for determining when the voltage level at the output terminal of said integration amplifier falls below a predetermined level.

14. An analog to digital converter in accordance with claim 12 wherein said comparator means comprises a high gain amplifier having an input terminal coupled to said integrator amplifier output terminal and a second input terminal coupled to said first reference voltage level.

15. An analog to digital converter in accordance with claim 16 and including means operable in said first portion of the operating cycle to directly connect sald comparator amplifier output terminal to said integrator amplifier second input terminal to stabilize both of said amplifiers.

* * * * *

UNITED STATES PATENT OFFICE
CERTIFICATE OF CORRECTION

Patent No. 3,747,089 Dated July 17, 1973

Inventor(s) Kenneth R. Sharples

It is certified that error appears in the above-identified patent and that said Letters Patent are hereby corrected as shown below:

Column 7, line 43 reads: "60 61 and 62. When the decade counter overflows at"; should read: --60, 61, and 62. When the decade counter overflows at --

Column 12, Claim 15, line 41 reads: "claim 16 and including means operable in said first por-"; should read: --claim 14 and including means operable in said first por- --

Column 12, claim 15, line 42 reads: "tion of the operating cycle to directly connect sald"; should read: --tion of the operating cycle to directly connect said --

Signed and sealed this 30th day of April 1974.

(SEAL)
Attest:

EDWARD M. FLETCHER, JR.
Attesting Officer

C. MARSHALL DANN
Commissioner of Patents